(12) United States Patent
Eib (10) Patent No.: US 8,012,873 B1
(45) Date of Patent: Sep. 6, 2011

(54) METHOD FOR PROVIDING TEMPERATURE UNIFORMITY OF RAPID THERMAL ANNEALING

(75) Inventor: Nicholas K. Eib, San Jose, CA (US)

(73) Assignee: SuVolta, Inc., Los Gatos, CA (US)

( * ) Notice: Subject to any disclaimer, the term of this patent is extended or adjusted under 35 U.S.C. 154(b) by 243 days.

(21) Appl. No.: 12/369,169

(22) Filed: Feb. 11, 2009

(51) Int. Cl.
    *H01L 21/44* (2006.01)
(52) U.S. Cl. .............................. 438/663; 257/E21.497
(58) Field of Classification Search .................. 438/663; 257/E21.482, E21.497
    See application file for complete search history.

(56) References Cited

U.S. PATENT DOCUMENTS

| 4,621,413 | A * | 11/1986 | Lowe et al. | 438/301 |
| 6,380,044 | B1 * | 4/2002 | Talwar et al. | 438/308 |
| 7,067,408 | B2 * | 6/2006 | Hong et al. | 438/585 |
| 2008/0308816 | A1 | 12/2008 | Miller et al. | 257/76 |

* cited by examiner

*Primary Examiner* — Chandra Chaudhari
(74) *Attorney, Agent, or Firm* — Baker Botts L.L.P.

(57) ABSTRACT

A method for annealing a semiconductor device having at least one polysilicon region formed on a substrate, comprises growing dielectric material on the substrate adjacent to the polysilicon region. The method continues by polishing a surface of the dielectric material and by depositing a layer of a semi-transparent material on both the surface of the dielectric material and the surface of the polysilicon region. The method concludes by annealing the semiconductor device.

16 Claims, 8 Drawing Sheets

METHOD FOR PROVIDING TEMPERATURE UNIFORMITY OF RAPID THERMAL ANNEALING

TECHNICAL FIELD OF THE INVENTION

The present disclosure relates generally to semiconductor devices and more particularly to a method for providing temperature uniformity of rapid thermal annealing.

BACKGROUND OF THE INVENTION

Rapid Thermal Processing (or RTP) refers to a semiconductor manufacturing process which heats silicon wafers to high temperatures (up to 1200° C. or greater) on a timescale of several seconds or less. The wafers are then cooled slowly to avoid breakage due to thermal shock. Such rapid heating rates are attained by high intensity lamps or laser process. These processes are used for a wide variety of applications in semiconductor manufacturing including dopant activation, thermal oxidation, metal reflow and chemical vapor deposition. Rapid Thermal Annealing (or RTA) is a subset of RTP. However, rapid thermal annealing of semiconductor devices using conventional devices and processing techniques results in unexpected dopant diffusion, dopant loss, and possible temperature and dopant activation non-uniformity.

SUMMARY OF THE INVENTION

In accordance with the present invention, the disadvantages and problems associated with rapid thermal annealing processes have been substantially reduced or eliminated.

One embodiment of the present invention is a method for annealing a semiconductor device having at least one polysilicon region formed on a substrate. The method comprises growing dielectric material on the substrate adjacent to the polysilicon region. The method continues by polishing a surface of the dielectric material and by depositing a layer of a semi-transparent material on the surface of the dielectric material and the surface of the polysilicon region. The method concludes by annealing the semiconductor device.

Another embodiment of the present invention is a method for annealing a semiconductor device having at least one polysilicon region formed on a substrate. The method comprises growing dielectric material on the substrate adjacent to the polysilicon region. The method continues by polishing a surface of the dielectric material. The method continues by depositing a first layer of a semi-transparent material on the surface of the dielectric material and the surface of the polysilicon region, and by depositing a second layer of semi-transparent material on the first layer of semi-transparent material. The method concludes by annealing the semiconductor device.

The following technical advantages may be achieved by some, none, or all of the embodiments of the present invention.

The addition of a layer of semi-transparent material to the semiconductor device prior to the rapid thermal annealing process can be used to balance the absorbed energies as between the active regions beneath the dielectric material and the polysilicon region. By adding the layer of semi-transparent material, the impedance matching of the dielectric material and active regions beneath it (e.g., $SiO_2$/Si stack) is lowered, thereby lowering the temperature in those active regions of the substrate. Simultaneously, the impedance matching of the polysilicon region is increased, thereby raising the temperature in the polysilicon region. Therefore, the disclosed process for rapid thermal annealing a semiconductor device can lead to better control of temperature gradients and, consequently, better control of the activation of dopants within the semiconductor device. If desired, the disclosed process for rapid thermal annealing the semiconductor device can lead to temperature uniformity within the semiconductor device and/or uniform dopant activation within the semiconductor device. This type of control was lacking in prior rapid thermal annealing processes.

In particular semiconductor devices that includes spacers on the sidewalls of polysilicon regions, multiple layers of semi-transparent material may be added prior to the rapid thermal annealing process. If the spacers comprise silicon nitride, then a layer of silicon dioxide may be added on the polysilicon regions and on the dielectric material. A layer of silicon nitride may then be added on the layer of silicon dioxide. In this regard, the multiple layers of semi-transparent material still provide the temperature and dopant activation control as described above. However, when the silicon nitride layer is etched, the silicon dioxide layer will provide an etch stop. Moreover, when the silicon dioxide layer is etched, the silicon nitride in the spacers will not be disturbed. Thus, the multiple layers of semi-transparent material provide an ease of manufacturing the semiconductor device.

These and other advantages, features, and objects of the present invention will be more readily understood in view of the following description, drawings, and claims.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION

Figure 1A:
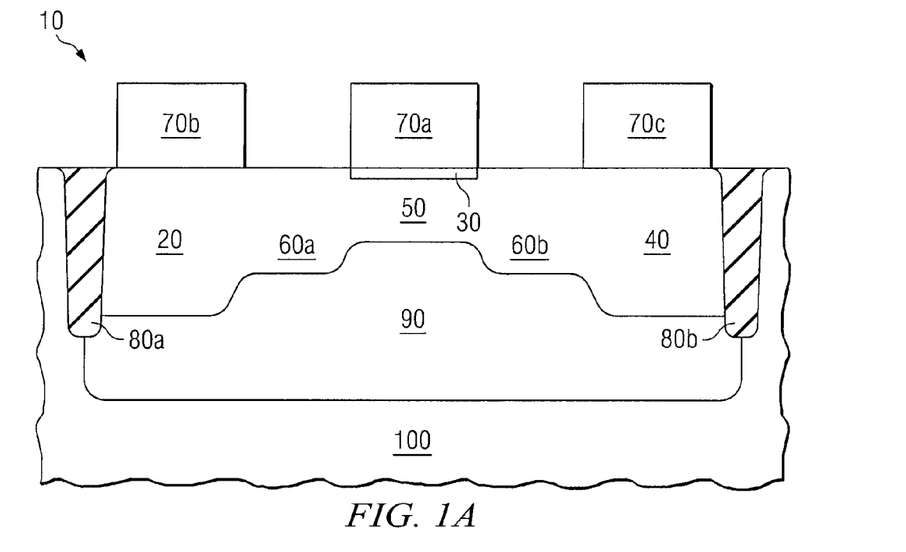
FIGS. 1A-1E illustrate one example method of fabricating a semiconductor device using rapid thermal annealing.

FIGS. 1A-E illustrate one example method of fabricating a semiconductor device 10 using rapid thermal annealing. The various elements of semiconductor device 10 in FIGS. 1A-1E are not necessarily drawn to scale. FIG. 1A illustrates a cross-sectional view of device 10 after particular steps during fabrication have been completed to form various components of device 10. Although the following description will be detailed with respect to fabricating a Junction Field Effect Transistor (JFET), it should be understood that the described method of fabrication can be applied to many different types of semiconductor devices, such as, for example, CMOS, MOSFET, or any other suitable type of Field Effect Transistors. Moreover, the described method of fabrication can be applied to any polysilicon structure of these different types of transistors, such as any or all of the source, drain, or gate of a transistor.

As shown in FIG. 1A, semiconductor device 10 has been constructed to form an active region in a well region 90 on a substrate 100. In one embodiment, device 10 can be formed using a silicon-on-insulator architecture. Once semiconductor device 10 is completed, the active region may include a source region 20, a gate region 30, a drain region 40, a channel region 50, and link regions 60a-b. The active region may be isolated from other regions of device 10 by field oxide regions 80a-b. The active regions are coupled to external circuitry using polysilicon regions 70a-c. Polysilicon regions 70a, 70b, and 70c form a gate contact region, a source contact region, and a drain contact region, respectively.

Substrate 100 represents bulk semiconductor material, such as materials from Group IV, or a compound semiconductor from Group III and Group V of the periodic table. In particular embodiments, substrate 100 is formed of single-crystal silicon. In other embodiments, substrate 100 is an alloy of silicon and at least one other material. For example, substrate 100 may be formed of silicon-germanium. In yet other embodiments, substrate 100 is formed of single-crystal germanium or pure germanium. Moreover, semiconductor device 10 may comprise a silicon-on-insulator (SOI) wafer. Substrate 100 may have a particular conductivity type, such as p-type or n-type. In particular embodiments, semiconductor device 10 may represent a portion of a substrate 100 that is shared by a plurality of different semiconductor devices (not illustrated in FIG. 1).

Well region 90 may comprise p-type well regions or n-type well regions formed in substrate 100, as appropriate. A p-type well region 90 is appropriate when an n-type channel region 50 will be formed. An n-type well region 90 is appropriate when a p-type channel region 50 will be formed. For p-type well regions, boron, gallium, indium, and/or other p-type material atoms may be implanted. For n-type well regions, antimony, arsenic, phosphorous, and/or other n-type material atoms may be implanted.

Channel region 50 provides a path to conduct current between source region 20 and drain region 40. Channel region 50 is formed by the addition of dopants to well region 90. For example, the dopants may represent particles of n-type doping material such as antimony, arsenic, phosphorous, or any other appropriate n-type dopant. Alternatively, the dopants may represent particles of p-type doping material such as boron, gallium, indium, or any other suitable p-type dopant. The doping concentration for channel region 50 may range from $1E+17$ atoms/cm$^3$ to $1E+20$ atoms/cm$^3$. In general, the doping concentration of channel region 50 may be lower than source region 20 and drain region 40. Moreover, the doping concentration for channel region 50 may be maintained such that device 10 operates in an enhancement mode, with a current flowing between drain region 40 and source region 20 when a positive voltage differential is applied between source region 20 and gate region 30.

Source region 20 and drain region 40 each comprise regions formed by the addition of dopants to well region 90. Thus, for an n-channel device 10, source region 20 and drain region 40 are doped with n-type impurities. For a p-channel device 10, source region 20 and drain region 40 are doped with p-type impurities. In particular embodiments, source region 20 and drain region 40 have a doping concentration at or higher than $1E+19$ atoms/cm$^3$. In particular embodiments, source region 20 and drain region 40 are formed by the diffusion of dopants through corresponding connection regions 70b and 70c, respectively. Consequently, in such embodiments, the boundaries and/or dimensions of source region 20 and drain region 40 may be precisely controlled.

In some embodiments, device 10 may comprise link regions 60a and 60b. Link regions 60a and 60b may comprise active regions formed by doping well region 90 with n-type or p-type impurities, as appropriate. Because link regions 60a and 60b are of the same conductivity type as source region 20 and drain region 40, however, the boundary between source region 20 and link region 60a and the boundary between drain region 40 and link region 60b may be undetectable once the relevant regions have been formed. For example, in particular embodiments, source region 20 and drain region 40 are formed by diffusing dopants through connection regions 70b and 70c, respectively. Ion implantation may then be used to add dopants to appropriate regions of well region 90, thereby forming link regions 60a and 60b. Because the doping concentrations for these regions may be similar, the boundary between source region 20 and link region 60a and the boundary between drain region 40 and link region 60b may be substantially undetectable after semiconductor device 10 has been formed. Thus, channel region 50 may provide a path to conduct current between source region 20 and drain region 40 through link regions 60a and 60b.

Gate region 30 may be formed by doping well region 90 with a second type of dopant. As a result, gate region 30 has a second conductivity type. Thus, for an n-channel device 10, gate region 30 is doped with p-type impurities. For a p-channel device 10, gate region 30 is doped with n-type impurities. In particular embodiments, gate region 30 is doped with the second type of dopant to a concentration at or higher than $1E+18$ atoms/cm$^3$. After device 10 is formed, when a voltage is applied to gate region 30, the applied voltage alters the conductivity of the neighboring channel region 50, thereby facilitating or impeding the flow of current between source region 20 and drain region 40. As with regions 20 and 40, gate region 30 may be formed by diffusing dopants from a corresponding connection region 70a.

Figure 1B:
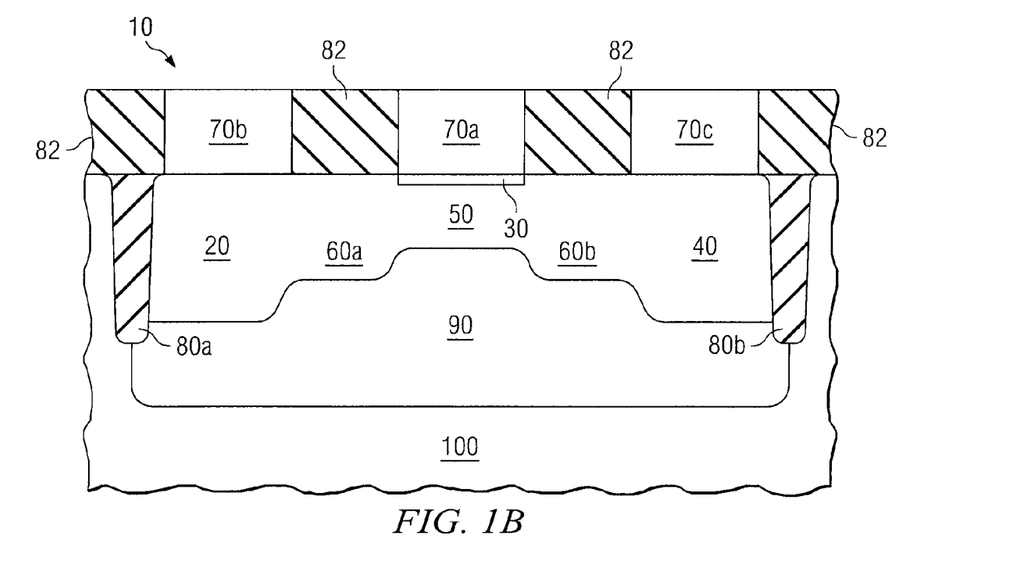

FIG. 1B illustrates the formation of an interlayer dielectric material 82. In particular, the gaps between polysilicon regions 70a-c are filled with a suitable interlayer dielectric material 82, such as, for example, silicon dioxide ($SiO_2$). There are many ways to grow silicon dioxide on the surface of silicon, but it is often done through a process known as thermal oxidation. Thermal oxidation includes exposing the silicon to oxidizing agents such as water and oxygen at elevated temperatures. This process has good control over the thickness and properties of the $SiO_2$ layer. Next, the excess dielectric material 82 is polished, for example using a chemical mechanical polish (CMP). In one embodiment, dielectric material 82 is substantially coplanar with polysilicon regions 70 after the polishing. In one embodiment, the polysilicon regions 70a-c are formed 50 nm tall and 60 nm wide. Moreover, dielectric material 82 is also 50 nm tall and coplanar with the polysilicon regions 70.

Figure 1C:
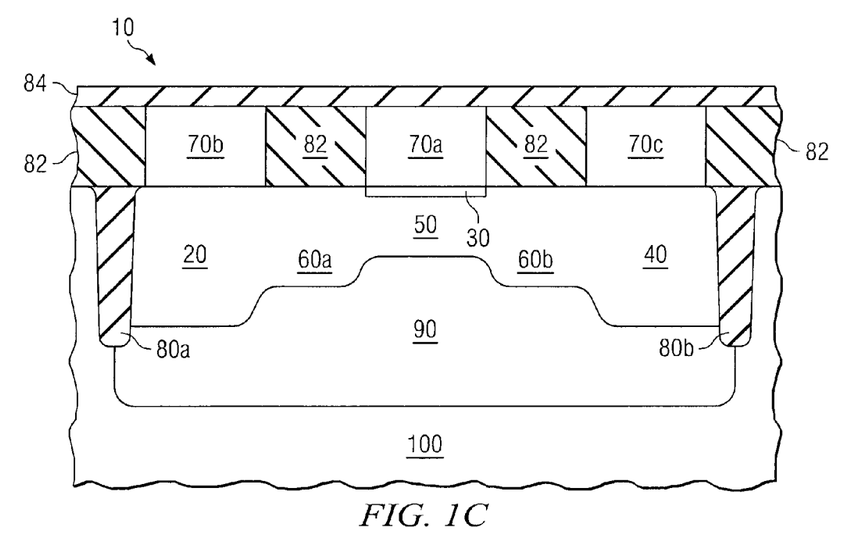

FIG. 1C illustrates the formation of a semi-transparent material layer 84 on the surface of polysilicon regions 70a-c and interlayer dielectric material 82. In one embodiment, silicon nitride ($Si_3N_4$) is used for layer 84. In another embodiment, silicon dioxide may be used in layer 84. The thickness of layer 84 can be adjusted to control the heat that is applied to either the active regions beneath the dielectric material 82, or the active regions beneath the polysilicon regions 70a-c during a subsequent annealing process, as will be described in greater detail below. In one embodiment, layer 84 has a uniform thickness over dielectric material 82 and polysilicon regions 70a-c.

In some embodiments, the CMP polish rate of dielectric material 82 (e.g., silicon dioxide) is higher than the erosion rate of polysilicon regions 70. This may result in the dielectric material 82 being recessed below the top of the polysilicon region 70, such that it is not coplanar. This thickness difference may vary from wafer to wafer, resulting in loss of temperature control during the flash anneal process. However, the formation of semi-transparent material layer 84 is controllable such that its thickness can be adjusted to compensate for these wafer to wafer differences. Semi-transparent material layer 84 can be either conformal or planarizing. As will be described in greater detail below, either is effective at controlling temperature of the active region of device 10.

Figure 1D:
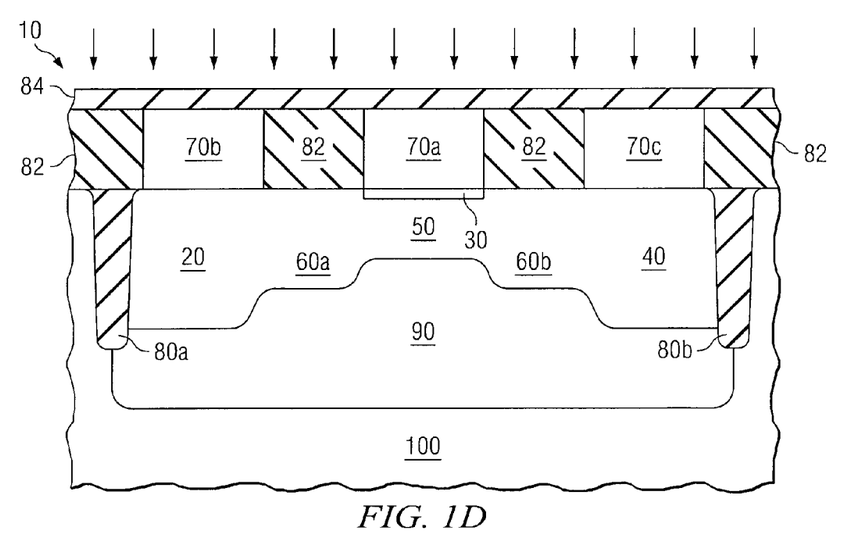
Figure 7:
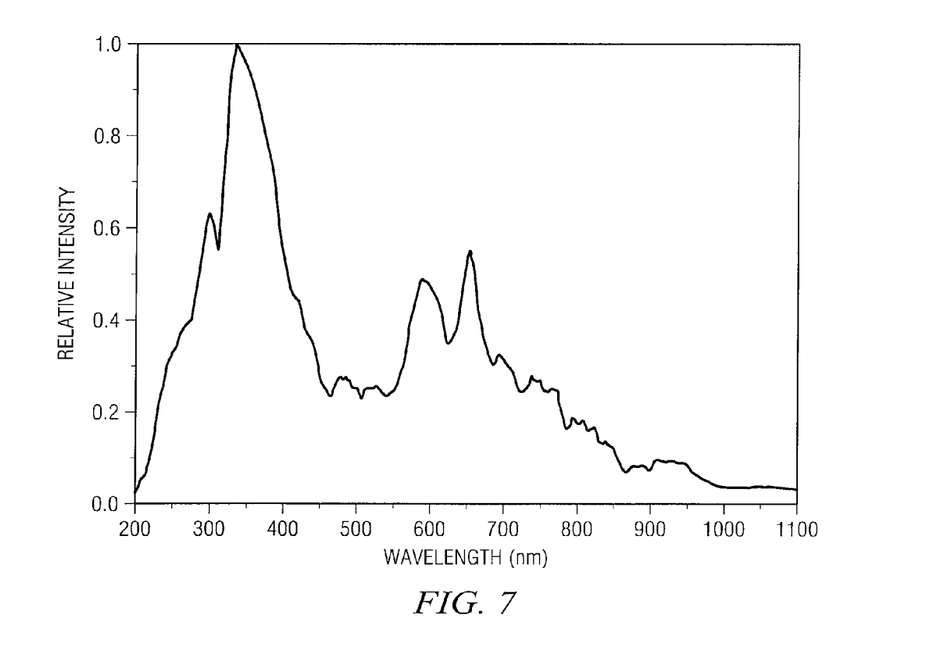
FIG. 7 illustrates an example output spectrum for a Mattson Ar flash lamp that may be used in one embodiment of rapid thermal annealing.

FIG. 1D illustrates the activation of dopants in the active region of semiconductor device 10 using a rapid thermal annealing process. In one embodiment, the entire device 10 undergoes rapid thermal annealing using a Mattson Ar flash lamp that exhibits an output spectrum as illustrated in greater detail in FIG. 7. Referring to FIG. 7, a Mattson Ar flash lamp may operate in a wavelength spectrum ranging from 200 nm to 1100 nm, and may achieve a maximum relative intensity in a wavelength spectrum somewhere between 200 nm to 500 nm. Although the present disclosure is detailed with reference to a Mattson Ar flash lamp, other vendor's Ar flash lamps can be used with similar results. Moreover, the disclosed concepts can be applied to other technologies such as halogen or Xe flash tubes. The specifics of the temperature differences generally depend on the lamp output spectrum and can be controlled using the concepts disclosed in this description.

Silicon nitride or silicon dioxide are good candidates for layer 84 because of their favorable optical properties and ease of later removal using conventional processes. To be an effective candidate for layer 84, one favorable characteristic is low imaginary refractive index (k<1.0) in the wavelengths where the flash lamp produces the majority of its output, such as in the 250 nm to 450 nm wavelength spectrum using a Mattson Ar flash lamp. Other candidates for layers 84 include a number of oxides and oxy-nitrides that satisfy this low k characteristic. Some examples are $Al_2O_3$, AlON, $CaF_2$, $HfO_2$, and $Y_2O_2$. In addition, although the description is detailed with reference to PECVD nitrides ($Si_3N_4$) where the refractive index n=2.6 to 2.7, other nitrides can also be used. For example, a nitride that is not stokiometric ($Si_xN_{1-x}$) where the refractive index n=1.9 to 2.1 may also be used. In this example, the flash anneal thermal conclusions are still valid but the optimal thicknesses of various materials would change.

Referring back to FIG. 1D, an example rapid thermal annealing process is described in greater detail. An arbitrary 10 kW per second flash may be applied for a duration of 0.4 ms. The annealing of device 10 does not begin at room temperature. Typically, device 10 is slowly heated to 700° C. by conventional means. The 0.4 ms energetic flash then elevates device 10 another 300 to 400° C. to a maximum of 1000 to 1100° C., whereupon device 10 rapidly cools back to 700° C. In general, roughly two-thirds of the maximum temperature rise in either the active regions beneath the dielectric material 82 or in the polysilicon regions 70a-c occurs in the top 10 nm of each region.

Without layer 84, the device experiences better energy transfer across the air/dielectric material 82 interface, through dielectric material 82, across the dielectric material 82/silicon interfaces, and into the underlying silicon as compared to the air/polysilicon region 70 interface into the polysilicon. When silicon dioxide is used as the dielectric material 82, this principle holds true for at least a range of thicknesses of from 25 to 65 nm and from 140 to 170 nm. Thus, the absorbed energies in different parts of the silicon are unbalanced. Other dielectric materials 82 have different refractive indices and will have different ranges of thickness validity.

The addition of layer 84 prior to the rapid thermal annealing process can be used to balance the absorbed energies as between the active regions beneath dielectric material 82 and beneath the polysilicon regions 70a-c. By adding layer 84, the impedance matching of the dielectric material 82 and active regions beneath it (e.g., $SiO_2$/Si stack) is lowered, thereby reducing the energy transfer and lowering the temperature in those active regions of substrate 100. Simultaneously, the impedance matching of the polysilicon regions 70a-c is increased, thereby increasing the energy transfer and raising the temperature in the polysilicon regions 70a-c. Therefore, the disclosed process for rapid thermal annealing semiconductor device 10 can lead to better control of temperature gradients and, consequently, better control of the activation of dopants within semiconductor device 10. If desired, the disclosed process for rapid thermal annealing semiconductor device 10 can lead to temperature uniformity within semiconductor device 10 and/or uniform dopant activation within semiconductor device 10. This type of control was lacking in prior rapid thermal annealing processes.

Figure 1E:
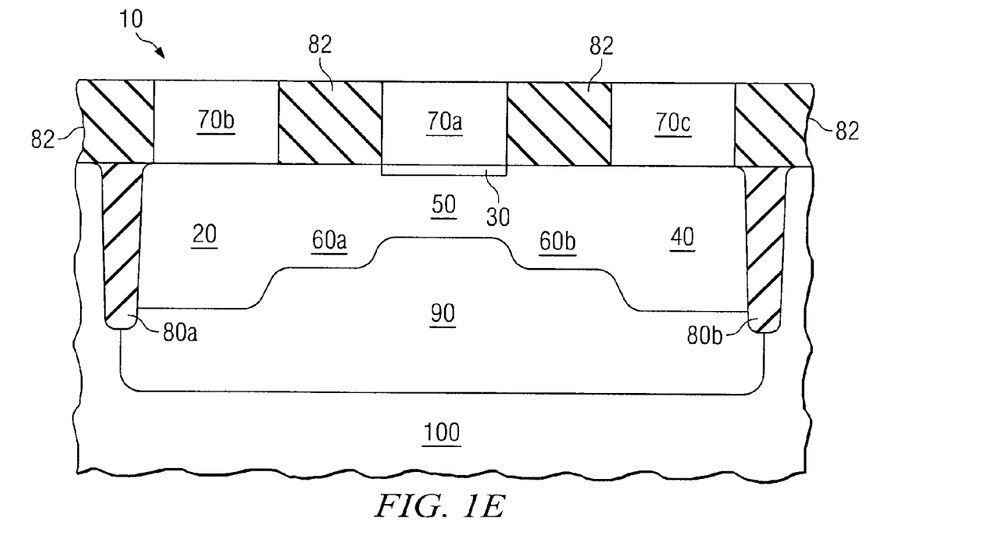

FIG. 1E shows semiconductor device 10 after layer 84 is removed using any suitable etching process. Next, additional steps that are not shown are completed to form the remainder of semiconductor device 10 using suitable fabrication techniques, including but not limited to patterning and depositing metal interconnects.

Figure 2:
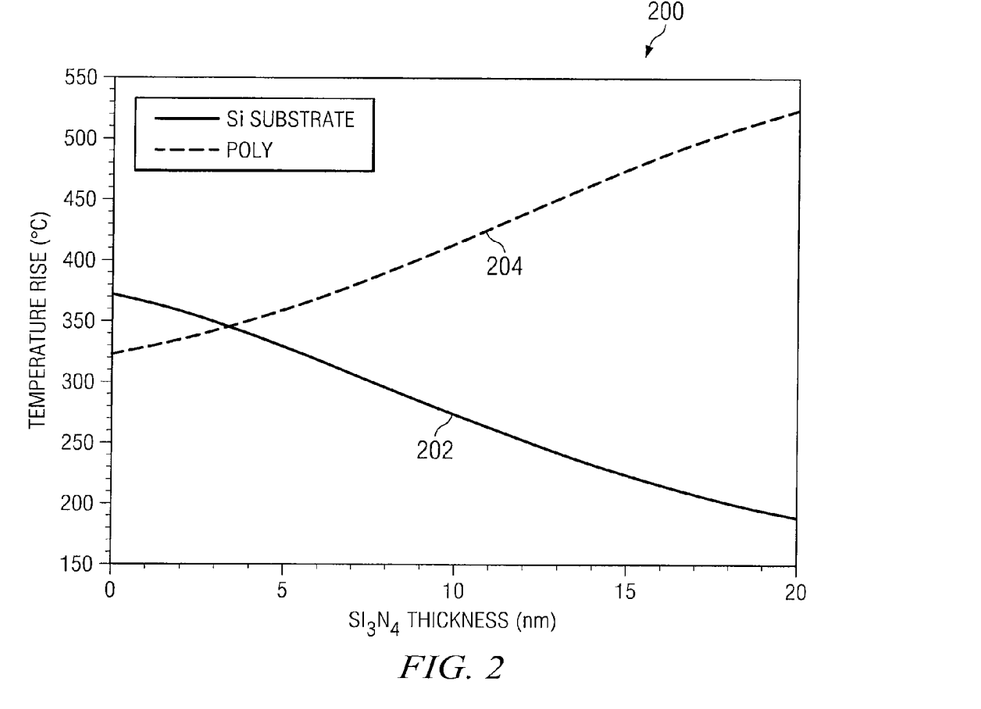
FIG. 2 illustrates a graph depicting the temperature rise in silicon or polysilicon as a function of the thickness of silicon nitride applied to a semiconductor device prior to rapid thermal annealing.

FIG. 2 illustrates a graph 200 depicting the temperature rise in silicon or polysilicon as a function of the thickness of silicon nitride applied as layer 84, as described above with respect to FIG. 1C. The x-axis of graph 200 relates to the thickness (nm) of silicon nitride in layer 84. The y-axis of graph 200 relates to the temperature rise (° C.) of the silicon or polysilicon regions, such as in the active regions beneath the dielectric material 82 and in the polysilicon regions 70a-c. Graph 200 comprises a curve 202 that relates to the temperature rise of silicon regions beneath dielectric material 82 as a function of silicon nitride thickness. Graph 200 further comprises a curve 204 that relates to the temperature rise of polysilicon regions 70a-c as a function of silicon nitride thickness. As is illustrated in graph 200, the temperature cross-over point for curves 202 and 204 is at an approximately 3 nm thickness for the silicon nitride. Thus, a 3 nm thickness of silicon nitride applied as layer 84 will result in the same temperature rise at the top of the silicon regions beneath dielectric material 82 as at the top of polysilicon regions 70a-c. Equalization of these temperatures can reduce local temperature variations due to area coverage differences, dependence on line widths, and possibly wafer warp. In one embodiment, this will allow the use of higher temperatures during the annealing process.

The equalized initial temperature profiles are still separated by roughly 40 nm of vertical distance because, as described above, roughly two-thirds of the maximum temperature rise occurs in the top 10 nm of each region. The resulting temperature gradients may still tend to drive dopant diffusion toward the temporarily cooler regions under the polysilicon regions 70a-c. This suggests that choosing a thicker layer 84 of silicon nitride will create a higher initial temperature in polysilicon regions 70a-c, which may reduce the effect of this temporary temperature difference. For example, layer 84 of silicon nitride may have a uniform thickness ranging from 4 nm-6 nm to account for this temperature difference.

In a particular embodiment, the thickness of the silicon nitride applied over the polysilicon regions 70*a-c* may be greater than, less than, or equal to the thickness of the silicon nitride applied over the dielectric material 82. By varying the thickness of silicon nitride over polysilicon regions 70*a-c* in comparison to the thickness of silicon nitride over dielectric material 82, the temperature rise in particular regions of semiconductor device 10 may be customized. For example, by increasing the thickness of silicon nitride over the polysilicon regions 70*a-c* to 6 nm, the temperature rise in those regions may be roughly 375° C. By decreasing the thickness of silicon nitride over dielectric material 82 to 1 nm, the temperature rise in the silicon regions beneath dielectric material 82 may be roughly 370° C. Other customizations are readily available by determining temperature rise as a function of silicon nitride thickness using curves 202 and 204 in FIG. 2. A customized thickness of silicon nitride in layer 84 may be achieved by masking various regions of semiconductor device 10 and depositing silicon nitride in multiple steps, rather than depositing a uniformly thick layer 84 of silicon nitride.

Figure 3:
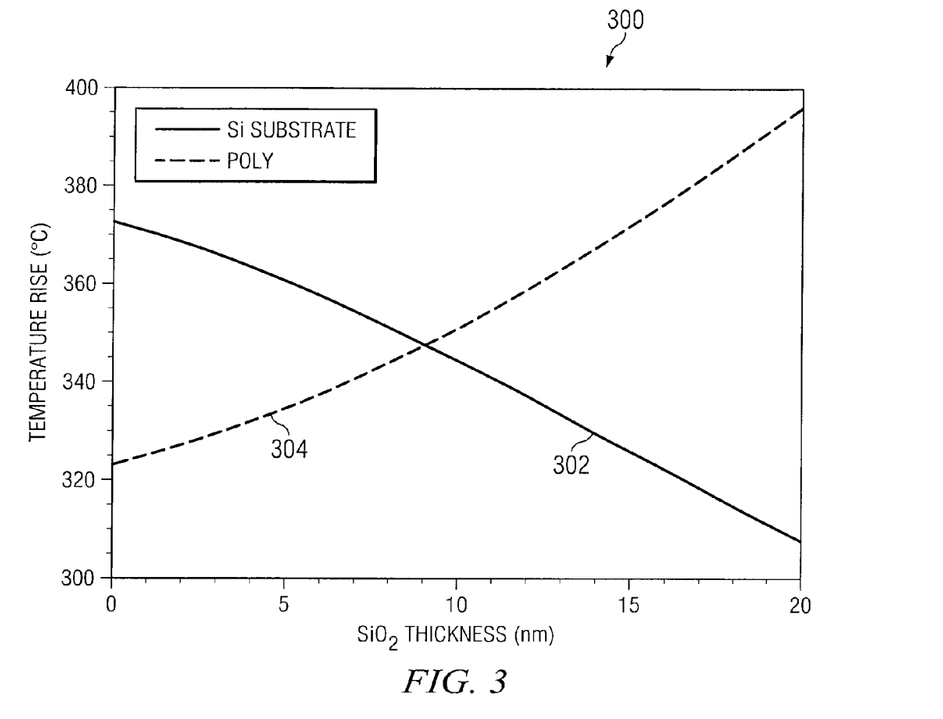
FIG. 3 illustrates a graph depicting the temperature rise in silicon or polysilicon as a function of the thickness of silicon dioxide applied to a semiconductor device prior to rapid thermal annealing.

FIG. 3 illustrates a graph 300 depicting the temperature rise in silicon or polysilicon as a function of the thickness of silicon dioxide applied as layer 84, as described above with respect to FIG. 1C. The x-axis of graph 300 relates to the thickness (nm) of silicon dioxide in layer 84. The y-axis of graph 300 relates to the temperature rise (° C.) of the silicon or polysilicon regions, such as in the active regions beneath the dielectric material 82 and in the polysilicon regions 70*a-c*. Graph 300 comprises a curve 302 that relates to the temperature rise of silicon regions beneath dielectric material 82 as a function of silicon dioxide thickness. Graph 300 further comprises a curve 304 that relates to the temperature rise of polysilicon regions 70*a-c* as a function of silicon nitride thickness. As is illustrated in graph 300, the temperature cross-over point for curves 302 and 304 is at an approximately 9 nm thickness for the silicon dioxide. Thus, a 9 nm thickness of silicon dioxide applied as layer 84 will result in the same temperature rise at the top of the silicon regions beneath dielectric material 82 as at the top of polysilicon regions 70*a-c*. Equalization of these temperatures can reduce local temperature variations due to area coverage differences, dependence on line widths, and possibly wafer warp. In one embodiment, this will allow the use of higher temperatures during the annealing process.

The equalized initial temperature profiles are still separated by roughly 40 nm of vertical distance because, as described above, roughly two-thirds of the maximum temperature rise occurs in the top 10 nm of each region. The resulting temperature gradients may still tend to drive dopant diffusion toward the temporarily cooler regions under the polysilicon regions 70*a-c*. This suggests that choosing a thicker layer 84 of silicon dioxide will create a higher initial temperature in polysilicon regions 70*a-c*, which may reduce the effect of this temporary temperature difference. For example, layer 84 of silicon dioxide may have a uniform thickness ranging from 10 nm-12 nm to account for this temperature difference.

In a particular embodiment, the thickness of the silicon dioxide applied over the polysilicon regions 70*a-c* may be greater than, less than, or equal to the thickness of the silicon dioxide applied over the dielectric material 82. By varying the thickness of silicon dioxide over polysilicon regions 70*a-c* in comparison to the thickness of silicon dioxide over dielectric material 82, the temperature rise in particular regions of semiconductor device 10 may be customized. For example, by increasing the thickness of silicon dioxide over the polysilicon regions 70*a-c* to 15 nm, the temperature rise in those regions may be roughly 370° C. By decreasing the thickness of silicon dioxide over dielectric material 82 to 5 nm, the temperature rise in the silicon regions beneath dielectric material 82 may be roughly 360° C. Other customizations are readily available by determining temperature rise as a function of silicon dioxide thickness using curves 302 and 304 in FIG. 3. A customized thickness of silicon dioxide in layer 84 may be achieved by masking various regions of semiconductor device 10 and depositing silicon dioxide in multiple steps, rather than depositing a uniformly thick layer 84 of silicon dioxide.

Figure 4A:
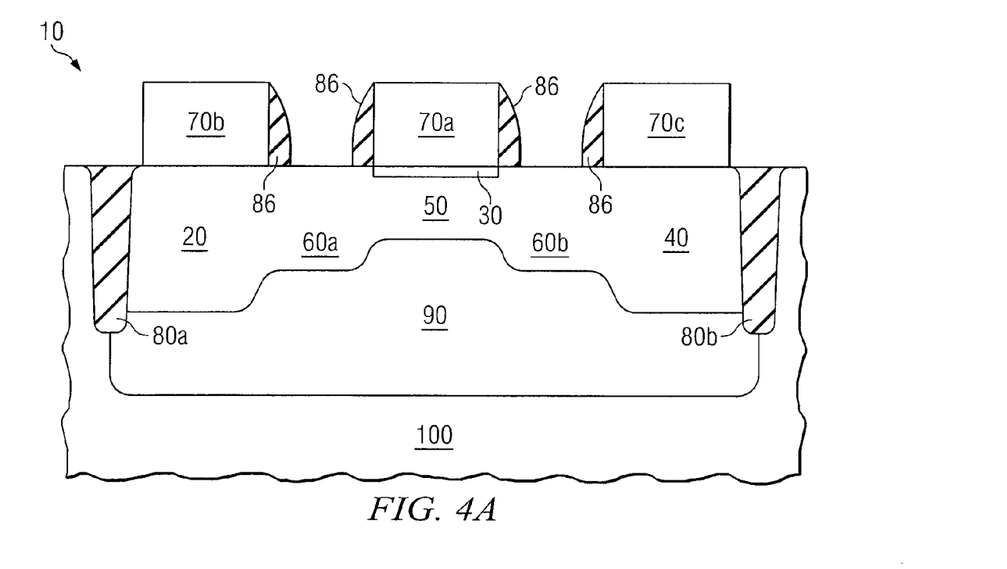
FIGS. 4A-4F illustrate another example method of fabricating a semiconductor device using rapid thermal annealing.

FIGS. 4A-F illustrate another example method of fabricating a semiconductor device 10. The various elements of the semiconductor device in FIG. 4 are not necessarily drawn to scale. FIG. 4A illustrates a cross-sectional view of device 10 after particular steps during fabrication have been completed to form various components of device 10. The difference between the semiconductor device 10 illustrated in FIG. 4A as compared to the semiconductor device 10 illustrated in FIG. 1A is that the device 10 in FIG. 4A includes spacers 86 on the sidewalls of the polysilicon region 70*a*. In one embodiment, spacers 86 comprise silicon nitride and have a width of approximately 100 angstroms. The presence of these silicon nitride spacers 86 suggest a modification in the type of semi-transparent material used in layer 84 during the annealing process, as described below in greater detail.

Figure 4B:
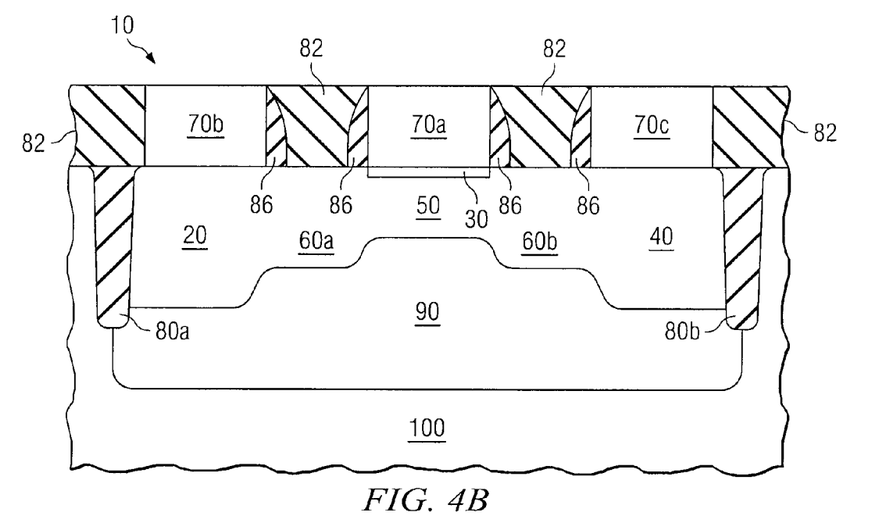

FIG. 4B illustrates the formation of interlayer dielectric material 82. In particular, the gaps between polysilicon regions 70*a-c* are filled with a suitable dielectric material 82, such as, for example, silicon dioxide. There are many ways to grow silicon dioxide on the surface of silicon, but it is often done through a process known as thermal oxidation. Thermal oxidation includes exposing the silicon to oxidizing agents at elevated temperatures. The process of thermal oxidation can be classified as either dry or wet oxidation. In dry oxidation, the oxidizing agent is oxygen. In wet oxidation, the main oxidizing agent is water. This process has good control over the thickness and properties of the $SiO_2$ layer. Next, the excess dielectric material 82 is polished, for example using a chemical mechanical polish. In one embodiment, the dielectric material 82 is substantially coplanar with polysilicon regions 70 after the polishing. In one embodiment, polysilicon regions 70*a-c* are 50 nm tall and 60 nm wide. Moreover, dielectric material 82 is also 50 nm tall and coplanar with the polysilicon regions 70.

Figure 4C:
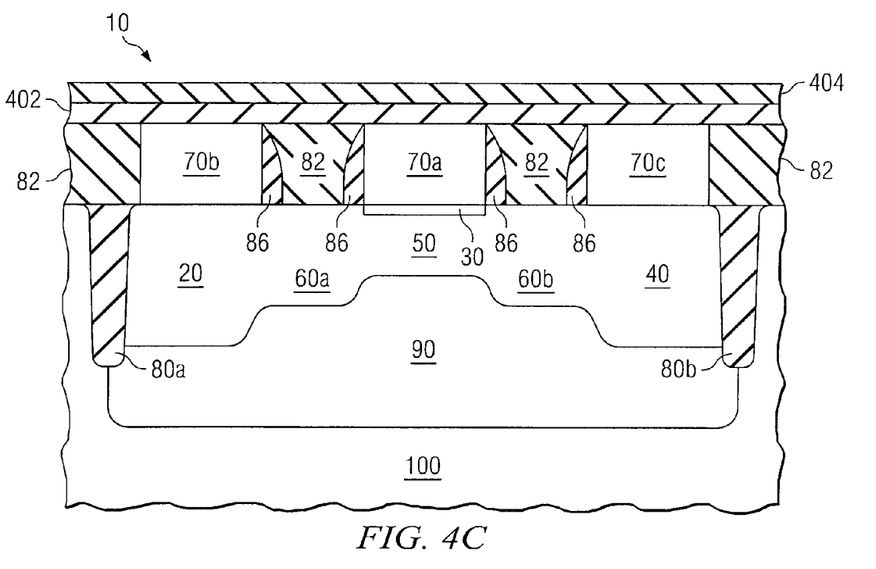

FIG. 4C illustrates the formation of a first semi-transparent material layer 402 and a second semi-transparent material layer 404 on the surface of polysilicon regions 70*a-c* and dielectric material 82. In one embodiment, silicon dioxide is used for layer 402 while silicon nitride is used for layer 404. In another embodiment, silicon nitride is used for layer 402 while silicon dioxide is used for layer 404. The silicon dioxide may be grown using a thermal oxidation process. The silicon nitride may be deposited by sputtering or chemical vapor deposition (CVD).

In some embodiments, the CMP polish rate of dielectric material 82 (e.g., silicon dioxide) is higher than the erosion rate of polysilicon regions 70. This may result in the dielectric material 82 being recessed below the top of the polysilicon region 70, such that is not coplanar. This thickness difference may vary from wafer to wafer, resulting in loss of temperature control during the flash anneal process. However, the formation of semi-transparent material layers 402 and/or 404 are controllable such that their thicknesses can be adjusted to compensate for these wafer to wafer differences. Semi-transparent material layers 402 and/or 404 can be either conformal or planarizing. As will be described in greater detail below, either is effective at controlling temperature of the active region of device 10.

The thicknesses of the materials used in layers 402 and 404 can vary. One has latitude in choosing the thickness combinations of the materials in layers 402 and 404 for effective thermal control while protecting spacers 86. For example, the thickness of the silicon nitride (or silicon dioxide) in layer 404, and/or the thickness of the silicon dioxide (or silicon nitride) in layer 402, can be adjusted to control the heat that is applied to either the active regions beneath dielectric material 82, or the active regions beneath polysilicon regions 70a-c during a subsequent annealing process. Moreover, the thickness of silicon nitride (or silicon dioxide) in layer 404, and/or the thickness of the silicon dioxide (or silicon nitride) in layer 402, may be uniformly applied or customized over dielectric material 82 and the polysilicon regions 70a-c. Furthermore, the thickness of the silicon nitride (or silicon dioxide) in layer 404 may vary while the thickness of the silicon dioxide (silicon nitride) in layer 402 may be uniform; and the thickness of the silicon nitride (or silicon dioxide) in layer 404 may be uniform while the thickness of the silicon dioxide (or silicon nitride) in layer 402 may vary.

Figure 4D:
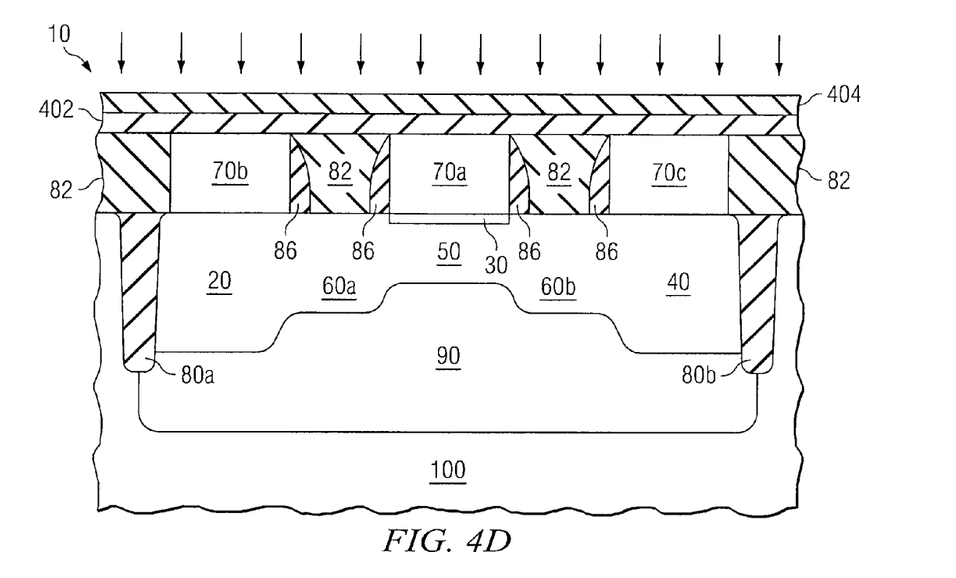

FIG. 4D illustrates the activation of dopants in the active region of semiconductor device 10 using a rapid thermal annealing process. The annealing process may be performed in a manner similar to that described above with respect to FIG. 1D, and may yield similar results and benefits as described above.

Figure 4E:
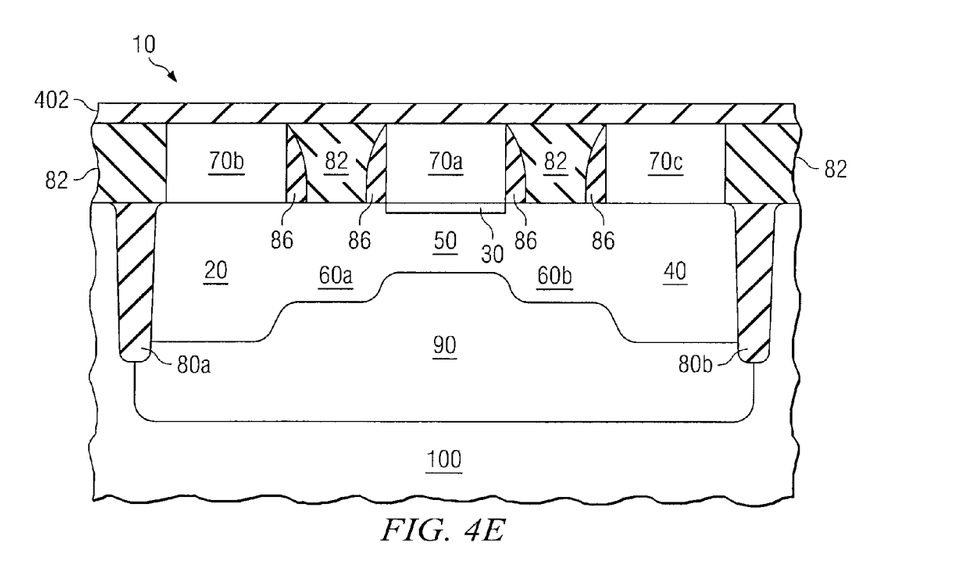
Figure 4F:
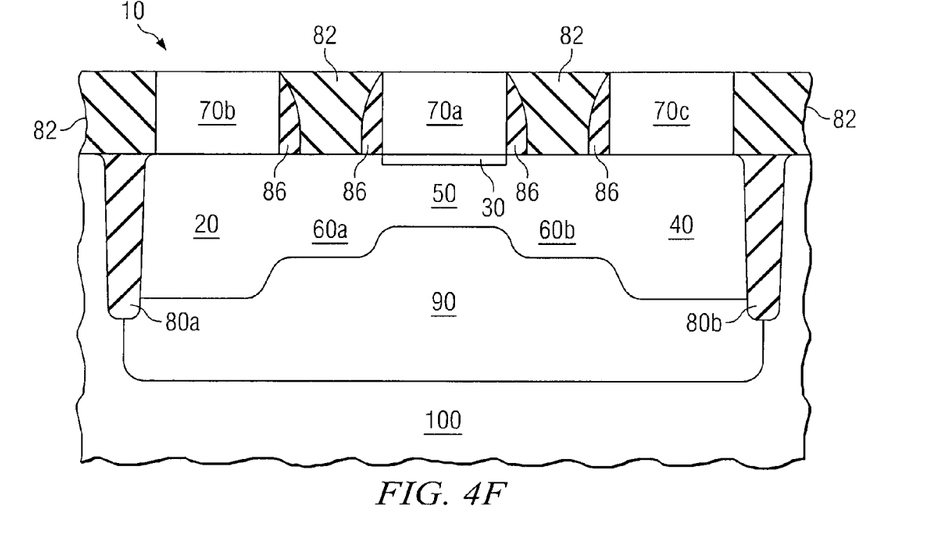

FIG. 4E shows semiconductor device 10 after the silicon nitride in layer 404 is removed using any suitable etching process. The silicon dioxide in layer 402 acts as an etch stop during this process and thereby protects silicon nitride spacers 86. Without this silicon dioxide in layer 402, the etching of the silicon nitride in layer 404 would attack the silicon nitride in spacers 86. FIG. 4F shows semiconductor device 10 after the silicon dioxide in layer 402 is removed using any suitable etching process. This etching stops at the top of the silicon nitride in spacers 86 and only minimally digs into the interlayer dielectric material 82, if at all. Depending on the material used to form spacers 86, appropriate materials may be used for layers 402 and 404 to provide the benefit of an etch stop, as described above. Next, additional steps that are not shown are completed to form the remainder of device 10 using suitable fabrication techniques, including but not limited to patterning and depositing metal interconnects.

Figure 5:
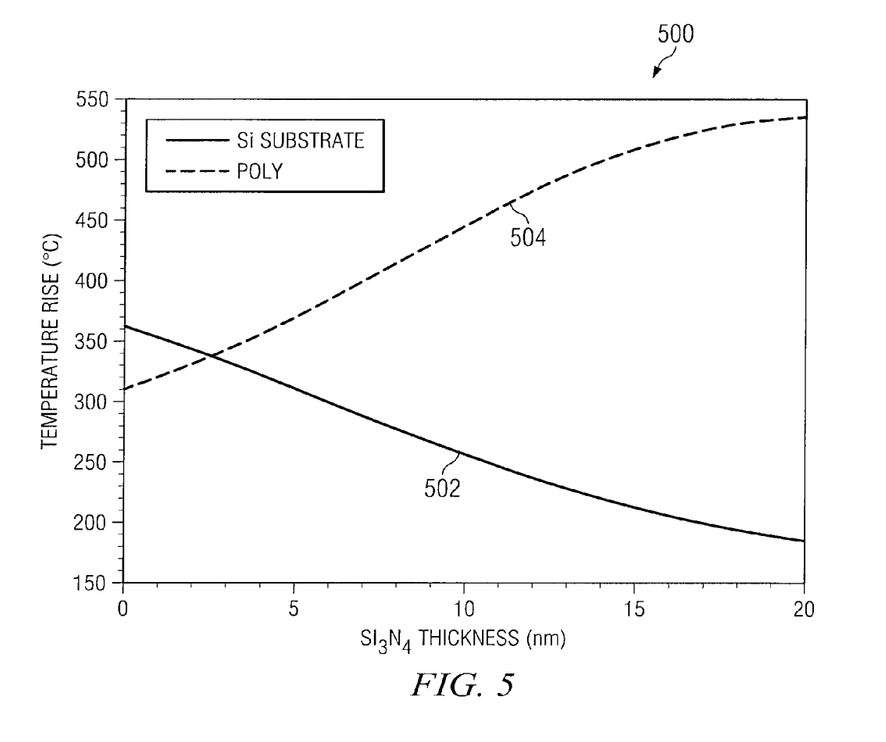
FIG. 5 illustrates a graph depicting the temperature rise in silicon or polysilicon as a function of the thickness of silicon nitride applied to a semiconductor device in conjunction with silicon dioxide, prior to rapid thermal annealing.

FIG. 5 illustrates a graph 500 depicting the temperature rise in silicon or polysilicon as a function of the thickness of silicon nitride applied as layer 404 when using a 4 nm thickness of silicon dioxide applied as layer 402. The x-axis of graph 500 relates to the thickness (nm) of silicon nitride in layer 404. The y-axis of graph 500 relates to the temperature rise (° C.) of the silicon or polysilicon regions, such as in the active regions beneath the dielectric material 82 and in the polysilicon regions 70a-c. Graph 500 comprises a curve 502 that relates to the temperature rise of silicon regions beneath dielectric material 82 as a function of silicon nitride thickness. Graph 500 further comprises a curve 504 that relates to the temperature rise of polysilicon regions 70a-c as a function of silicon nitride thickness. As is illustrated in graph 500, the temperature cross-over point for curves 502 and 504 is at a 3 nm thickness for the silicon nitride. Thus, a 3 nm thickness of silicon dioxide applied as layer 404 when using a 4 nm thickness of silicon dioxide applied as layer 402 will result in the same temperature rise at the top of the silicon regions beneath dielectric material 82 as at the top of polysilicon regions 70a-c. Equalization of these temperatures can reduce local temperature variations due to area coverage differences, dependence on line widths, and possibly wafer warp. In one embodiment, this will allow the use of higher temperatures during the annealing process.

The equalized initial temperature profiles are still separated by roughly 40 nm of vertical distance because, as described above, roughly two-thirds of the maximum temperature rise occurs in the top 10 nm of each region. The resulting temperature gradients may still tend to drive dopant diffusion toward the temporarily cooler regions under the polysilicon regions 70a-c. This suggests that choosing a thicker layer 404 of silicon nitride will create a higher initial temperature in polysilicon regions 70a-c, which may reduce the effect of this temporary temperature difference. For example, layer 404 of silicon nitride may have a uniform thickness ranging from 4 nm-6 nm to account for this temperature difference.

In a particular embodiment, the thickness of the silicon nitride applied in layer 404 over the polysilicon regions 70a-c may be greater than, less than, or equal to the thickness of the silicon nitride applied in layer 404 over the dielectric material 82. By varying the thickness of silicon nitride over polysilicon regions 70a-c in comparison to the thickness of silicon nitride over dielectric material 82, the temperature rise in particular regions of semiconductor device 10 may be customized. For example, by increasing the thickness of silicon nitride over the polysilicon regions 70a-c to 6 nm, the temperature rise in those regions may be roughly 375° C. By decreasing the thickness of silicon nitride over dielectric material 82 to 1 nm, the temperature rise in the silicon regions beneath dielectric material 82 may be roughly 370° C. Other customizations are readily available by determining temperature rise as a function of silicon nitride thickness using curves 502 and 504 in FIG. 5. A customized thickness of silicon nitride in layer 404 may be achieved by masking various regions of semiconductor device 10 and depositing silicon nitride in multiple steps, rather than depositing a uniformly thick layer 404 of silicon nitride.

Figure 6:
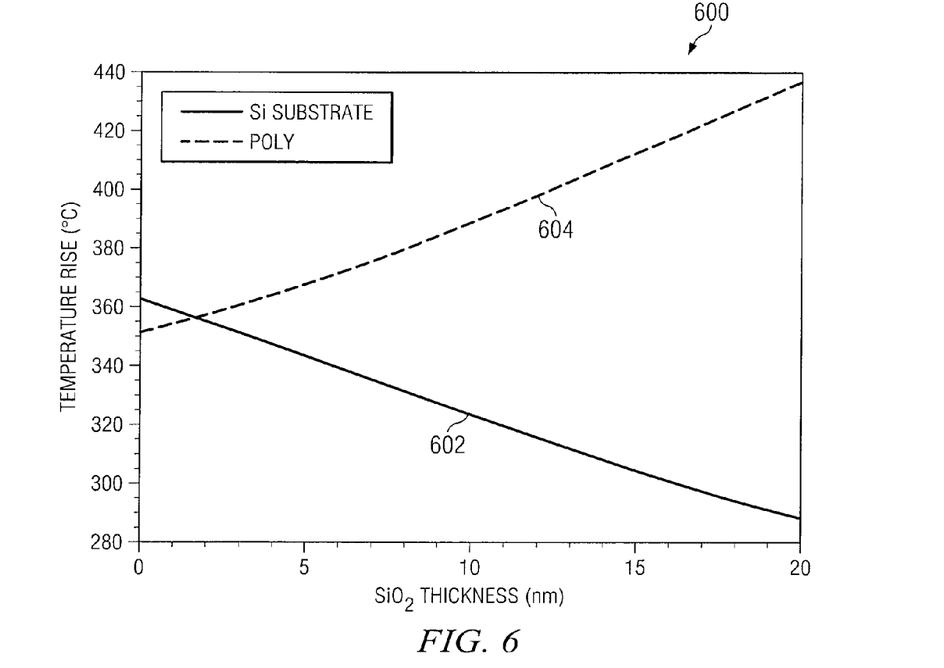
FIG. 6 illustrates a graph depicting the temperature rise in silicon or polysilicon as a function of the thickness of silicon dioxide applied to a semiconductor device in conjunction with silicon nitride, prior to rapid thermal annealing.

FIG. 6 illustrates a graph 600 depicting the temperature rise in silicon or polysilicon as a function of the thickness of silicon dioxide applied as layer 404 when using a 4 nm thickness of silicon nitride applied as layer 402. The x-axis of graph 600 relates to the thickness (nm) of silicon dioxide in layer 404. The y-axis of graph 600 relates to the temperature rise (° C.) of the silicon or polysilicon regions, such as in the active regions beneath the dielectric material 82 and in the polysilicon regions 70a-c. Graph 600 comprises a curve 602 that relates to the temperature rise of silicon regions beneath dielectric material 82 as a function of silicon dioxide thickness. Graph 600 further comprises a curve 604 that relates to the temperature rise of polysilicon regions 70a-c as a function of silicon dioxide thickness. As is illustrated in graph 600, the temperature cross-over point for curves 602 and 604 is at a 2 nm thickness for the silicon dioxide. Thus, a 2 nm thickness of silicon dioxide applied as layer 404 when using a 4 nm thickness of silicon nitride applied as layer 402 will result in the same temperature rise at the top of the silicon regions beneath dielectric material 82 as at the top of polysilicon regions 70a-c. Equalization of these temperatures can reduce local temperature variations due to area coverage differences, dependence on line widths, and possibly wafer warp. In one embodiment, this will allow the use of higher temperatures during the annealing process.

The equalized initial temperature profiles are still separated by roughly 40 nm of vertical distance because, as described above, roughly two-thirds of the maximum temperature rise occurs in the top 10 nm of each region. The resulting temperature gradients may still tend to drive dopant diffusion toward the temporarily cooler regions under the polysilicon regions 70a-c. This suggests that choosing a thicker layer 404 of silicon dioxide will create a higher initial temperature in polysilicon regions 70a-c, which may reduce the effect of this temporary temperature difference. For example, layer 84 of silicon dioxide may have a uniform thickness ranging from 3 nm-5 nm to account for this temperature difference.

In a particular embodiment, the thickness of the silicon dioxide applied over the polysilicon regions 70a-c may be greater than, less than, or equal to the thickness of the silicon dioxide applied over the dielectric material 82. By varying the thickness of silicon dioxide over polysilicon regions 70a-c in comparison to the thickness of silicon dioxide over dielectric material 82, the temperature rise in particular regions of semiconductor device 10 may be customized. For example, by increasing the thickness of silicon dioxide over the polysilicon regions 70a-c to 6 nm, the temperature rise in those regions may be roughly 370° C. By decreasing the thickness of silicon dioxide over dielectric material 82 to 1 nm, the temperature rise in the silicon regions beneath dielectric material 82 may be roughly 355° C. Other customizations are readily available by determining temperature rise as a function of silicon dioxide thickness using curves 602 and 604 in FIG. 6. A customized thickness of silicon dioxide in layer 404 may be achieved by masking various regions of semiconductor device 10 and depositing silicon dioxide in multiple steps, rather than depositing a uniformly thick layer 404 of silicon dioxide.

Although the present invention has been described in detail, it should be understood that various changes, substitutions and alterations can be made hereto without departing from the sphere and scope of the invention as defined by the appended claims.

What is claimed is:

1. A method for annealing a semiconductor device having a polysilicon gate contact region formed on a substrate, a polysilicon source contact region formed on the substrate, and a polysilicon drain contact region formed on the substrate, the method comprising:
    forming dielectric material on the substrate in gaps between the polysilicon gate contact region, the polysilicon source contact region, and the polysilicon drain contact region;
    polishing the dielectric material;
    depositing a layer of semi-transparent material on the dielectric material, the polysilicon gate contact region, the polysilicon source contact region, and the polysilicon drain contact region; and
    annealing the semiconductor device.

2. The method of claim 1, wherein the dielectric material comprises silicon dioxide.

3. The method of claim 1, wherein the semi-transparent material comprises silicon nitride.

4. The method of claim 1, wherein the semi-transparent material comprises silicon dioxide.

5. The method of claim 1, wherein the semi-transparent material comprises at least one of: $Al_2O_3$, AlON, $CaF_2$, $HfO_2$, and $Y_2O_2$.

6. The method of claim 1, wherein:
    annealing is performed using a flash lamp operating in the 200 nm to 1100 nm wavelength spectrum; and
    the semi-transparent material has a low dielectric constant for at least a portion of the 200 nm to 1100 nm wavelength spectrum.

7. The method of claim 1, wherein at least one of the polysilicon regions is approximately 50 nm tall.

8. The method of claim 1, wherein the thickness of the semi-transparent material is selected based on a desired temperature rise to be achieved in at least one of the polysilicon regions and in the substrate beneath the dielectric material.

9. The method of claim 1, wherein increasing the thickness of the layer of semi-transparent material causes an increase in temperature in at least one of the polysilicon regions and a decrease in temperature in the substrate beneath the dielectric material.

10. The method of claim 1, wherein decreasing the thickness of the layer of semi-transparent material causes a decrease in temperature in at least one of the polysilicon regions and an increase in temperature in the substrate beneath the dielectric material.

11. The method of claim 1, wherein depositing a layer of the semi-transparent material comprises:
    depositing a first thickness of the semi-transparent material on the surface of at least one of the polysilicon regions; and
    depositing a second thickness of the semi-transparent material on the surface of the dielectric material.

12. The method of claim 1, wherein the semiconductor device comprises a junction field effect transistor or a CMOS transistor.

13. The method of claim 1, wherein the semiconductor device includes spacers on sidewalls of the polysilicon gate contact region and the layer of semi-transparent material comprises a first layer of semi-transparent material, the method further comprising depositing a second layer of semi-transparent material on the first layer of semi-transparent material.

14. The method of claim 3, wherein the first layer of semi-transparent material comprises silicon dioxide and the second layer of semi-transparent material comprises silicon nitride.

15. The method of claim 3, wherein the first layer of semi-transparent material comprises silicon nitride and the second layer of semi-transparent material comprises silicon dioxide.

16. The method of claim 1, wherein annealing the semiconductor device comprises rapid flash annealing the semiconductor device.

* * * * *